United States Patent
Liu et al.

(10) Patent No.: US 6,486,025 B1
(45) Date of Patent: Nov. 26, 2002

(54) METHODS FOR FORMING MEMORY CELL STRUCTURES

(75) Inventors: Yuan-Hung Liu, Hsin-Chu (TW); Yeur-Luen Tu, Taichung (TW); Chia-Shiung Tsai, Hsin-Chu (TW); Min-Hwa Chi, Hsinchu (TW); Chih-Hsing Yu, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/047,265

(22) Filed: Jan. 14, 2002

(51) Int. Cl.[7] .......................................... H01L 21/8242
(52) U.S. Cl. ...................... 438/253; 438/255; 438/398; 438/689
(58) Field of Search ................................ 438/253, 254, 438/255, 396, 397, 398, 3, 689, 706

(56) References Cited

U.S. PATENT DOCUMENTS

| | | | |
|---|---|---|---|
| 6,006,767 A | * 12/1999 | Hecker et al. | 134/183 |
| 6,074,918 A | 6/2000 | Lee | |
| 6,143,604 A | * 11/2000 | Chiang et al. | 438/210 |
| 6,165,839 A | * 12/2000 | Lee et al. | 438/253 |
| 6,174,767 B1 | 1/2001 | Chi | |
| 6,207,579 B1 | 3/2001 | Chen | |
| 6,399,399 B2 | * 6/2002 | Yamamoto | 438/240 |

* cited by examiner

Primary Examiner—Tuan H. Nguyen
(74) Attorney, Agent, or Firm—Tung & Associates

(57) ABSTRACT

Within a first of a pair of methods for forming a memory cell structure there is employed a sacrificial spacer layer formed adjacent a capacitor structure and subsequently stripped therefrom to provide an air gap void interposed between a bitline stud layer and the capacitor structure. Within a second of the pair of methods for forming a memory cell structure there is employed a topographically variable thickness masking layer as a self aligned mask layer for forming a patterned capacitor plate layer from a topographic blanket capacitor plate layer. The methods provide for readily forming the memory cell structure with enhanced performance.

12 Claims, 4 Drawing Sheets

US 6,486,025 B1

METHODS FOR FORMING MEMORY CELL STRUCTURES

BACKGROUND OF THE INVENTION

1. Field of the Invention

The present invention relates generally to memory cell structures employed within semiconductor integrated circuit fabrications. More particularly, the present invention relates to methods for forming memory cell structures employed within semiconductor integrated circuit fabrications.

2. Description of the Related Art

Semiconductor integrated circuit fabrications are formed from semiconductor substrates within and upon which are formed semiconductor devices, and over which are formed patterned conductor layers which are separated by dielectric layers.

Common in the art of semiconductor integrated circuit fabrication, and in particular in the art of semiconductor integrated circuit memory fabrication, is the use and the fabrication of memory cell structures, and in particular dynamic random access memory (DRAM) cell structures. Dynamic random access memory (DRAM) cell structures typically comprises a field effect transistor (FET) device formed within and upon a semiconductor substrate, where one of a pair of source/drain regions within the field effect transistor (FET) device has formed thereover and electrically connected therewith a storage capacitor. Within a dynamic random access memory (DRAM) cell structure, a gate electrode of the field effect transistor (FET) device serves as a wordline which provides a switching function for charge introduction into and retrieval from the storage capacitor, while the other of the pair of source/drain regions within the field effect transistor (FET) device serves as a contact for a bitline conductor stud which introduces or retrieves charge with respect to the storage capacitor.

While the dynamic random access memory (DRAM) cell structure has clearly become ubiquitous in the art of semiconductor integrated circuit memory fabrication, and is thus essential in the art of semiconductor integrated circuit fabrication, the dynamic random access memory (DRAM) cell structure is nonetheless not entirely without problems in the art of semiconductor integrated circuit memory fabrication.

In that regard, as semiconductor integration levels have increased and semiconductor device and patterned conductor layer dimensions have decreased, it has become increasingly common in the art of semiconductor integrated circuit fabrication, and in particular in the art of semiconductor integrated circuit memory fabrication, to readily form dynamic random access memory (DRAM) cell structures with enhanced performance.

It is thus desirable in the art of semiconductor integrated circuit fabrication, and in particular in the art of semiconductor integrated circuit memory fabrication, to provide methods and materials through which there may be readily formed, with enhanced performance, dynamic random access memory (DRAM) cell structures.

It is towards the foregoing object that the present invention is directed.

Various methods have been disclosed in the art of semiconductor integrated circuit fabrication for forming, with desirable properties, dynamic random access memory (DRAM) cell structures.

Included among the methods, but not limited among the methods, are methods disclosed within: (1) Lee, in U.S. Pat. No. 6,074,918 (a method for forming a capacitor and bitline structure within a dynamic random access memory (DRAM) cell structure for use within a semiconductor integrated circuit memory fabrication, with improved alignment and etching margin, by forming a bitline contact stud layer independently of, and of a different height than, a capacitor contact stud layer); (2) Chi, in U.S. Pat. No. 6,174,767 (a method for forming a capacitor and bitline structure within a dynamic random access memory (DRAM) cell structure for use within a semiconductor integrated circuit memory fabrication, with attenuated bitline to bitline capacitance within the capacitor and bitline structure, by forming a pair of bitline structures within the capacitor and bitline structure at an equivalent topographic level with a capacitor within the capacitor and bitline structure); and (3) Chen, in U.S. Pat. No. 6,207,579 (a method for forming a capacitor and bitline structure within a dynamic random access memory (DRAM) cell structure for use within a semiconductor integrated circuit memory fabrication, with enhanced alignment, by forming a bitline conductor layer in a self-aligned fashion with respect to a pair of capacitor contact stud layers).

Desirable in the art of semiconductor integrated circuit fabrication, and in particular in the art of semiconductor integrated circuit memory fabrication, are additional methods and materials which may be employed for readily forming, with enhanced performance, dynamic random access memory (DRAM) cell structures.

It is towards the foregoing object that the present invention is directed.

SUMMARY OF THE INVENTION

A first object of the invention is to provide a method for forming a dynamic random access memory (DRAM) cell structure within a semiconductor integrated circuit fabrication.

A second object of the present invention is to provide a method in accord with the first object of the present invention, wherein the dynamic random access memory (DRAM) cell structure is readily formed with enhanced performance.

A third object of the present invention is to provide a method in accord with the first object of the present invention and the second object of the present invention, wherein the method is readily commercially implemented.

In accord with the objects of the present invention, there is provided by the present invention a pair of methods for forming a memory cell structure.

To practice a first of the methods of the present invention, there is provided a semiconductor substrate. There is then formed within and upon the semiconductor substrate a field effect transistor (FET) device comprising a gate dielectric layer formed upon the semiconductor substrate, a gate electrode formed upon the gate dielectric layer and a pair of source/drain regions formed into the semiconductor substrate and separated by the gate electrode. There is then formed over the field effect transistor (FET) device, and electrically connected with one of the pair of source/drain regions, a capacitor structure having a sidewall. There is then formed laterally adjacent the sidewall of the capacitor structure a sacrificial spacer layer. There is then formed laterally adjacent the sacrificial spacer layer and further spaced from the sidewall of the capacitor structure a passivating dielectric layer. There is then formed through the passivating dielectric layer a bitline stud layer electrically connected with the other of the pair of source/drain regions.

Finally, there is also stripped from adjacent the sidewall of the capacitor structure the sacrificial spacer, such as to provide an air gap void interposed between the capacitor structure and bitline stud layer.

To practice a second of the methods of the present invention, there is also first provided a semiconductor substrate. There is also then formed within and upon the semiconductor substrate a field effect transistor (FET) device comprising a gate dielectric layer formed upon the semiconductor substrate, a gate electrode formed upon the gate dielectric layer and a pair of source/drain regions formed into the semiconductor substrate and separated by the gate electrode. There is then formed over the field effect transistor (FET) device, and electrically connected with one of the pair of source/drain regions, a capacitor structure comprising a blanket capacitor plate layer having an upper topographic portion and a lower topographic portion. There is then formed over the blanket capacitor plate layer a variable thickness blanket mask layer having a greater thickness over the upper topographic portion of the blanket capacitor plate layer than over the lower topographic portion of the blanket capacitor plate layer. Finally, there is then etched completely through the lower topographic portion of the variable thickness blanket mask layer and blanket capacitor plate layer to form a patterned capacitor plate layer having formed thereupon a variable thickness patterned mask layer.

The present invention provides a pair of methods for forming a dynamic random access memory (DRAM) cell structure within a semiconductor integrated circuit fabrication, wherein the dynamic random access memory (DRAM) cell structure is readily formed with enhanced performance.

A first of the methods of the present invention realizes the foregoing object by employing when forming a memory cell structure for use within a semiconductor integrated circuit fabrication an air gap void interposed, at least in part, between: (1) a sidewall of a capacitor structure electrically connected with one of a pair of source/drain regions within a field effect transistor (FET) device within the memory cell structure; and (2) a bitline stud layer electrically connected with the other of the pair of source/drain regions within the field effect transistor (FET) device, where the bitline stud layer is adjacent to and extends above the sidewall of the capacitor structure. Within the first of the methods of the present invention, the air gap void provides for attenuated capacitor structure to bitline stud layer parasitic capacitance. In addition, within the first of the methods of the present invention, the air gap void is formed through selective removal of an anisotropically etched spacer layer formed adjacent a sidewall of the capacitor structure.

A second of the methods of the present invention realizes the foregoing object by employing for forming within a memory cell structure a patterned capacitor plate layer from a blanket capacitor plate layer having an upper topographic portion and a lower topographic portion a variable thickness blanket mask layer formed over the blanket capacitor plate layer. The variable thickness blanket mask layer has a greater thickness over the upper topographic portion of the blanket capacitor plate layer and a lesser thickness over the lower topographic portion of the blanket capacitor plate layer. By employing the variable thickness blanket mask layer formed over the blanket capacitor plate layer, the patterned capacitor plate layer may be formed from the blanket capacitor plate layer in a self aligned fashion by completely etching through the lower topographic portion of both the variable thickness blanket mask layer and the blanket capacitor plate layer but not completely through the upper topographic portion of either the variable thickness blanket mask layer or the blanket capacitor plate layer.

The methods of the present invention are readily commercially implemented.

The present invention employs methods and materials as are generally known in the art of semiconductor integrated circuit fabrication, but employed within the context of specific process orderings and specific materials limitations to provide a pair of methods for forming a pair of memory cell structures in accord with the present invention. Since it is thus at least in part specific process orderings and specific materials limitations which provide at least in part the present invention, rather than the existence of methods and materials which provides the present invention, the methods of the present invention are readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

Although the preferred embodiments of the present invention illustrate the invention most particularly within the context of a capacitor under bitline (CUB) dynamic random access memory (DRAM) cell structure, the present invention may nonetheless be employed within memory cell structures other than dynamic random access memory (DRAM) cell structures. In that regard, and in general, the first preferred embodiment of the present invention may be employed within memory cell structures which normally have a bitline stud layer adjacent to, and extending above, a sidewall of a capacitor structure. Similarly, the second preferred embodiment of the present invention may be employed for forming patterned capacitor plate layers from topographic blanket capacitor plate layers within any of several types of memory cell structures.

First Preferred Embodiment

Referring now to FIG. 1 to FIG. 4, there is shown a series of schematic cross-sectional diagrams illustrating the results of progressive stages in forming, in accord with a first preferred embodiment of the present invention, a dynamic random access memory (DRAM) cell structure within a semiconductor integrated circuit fabrication.

Figure 1:
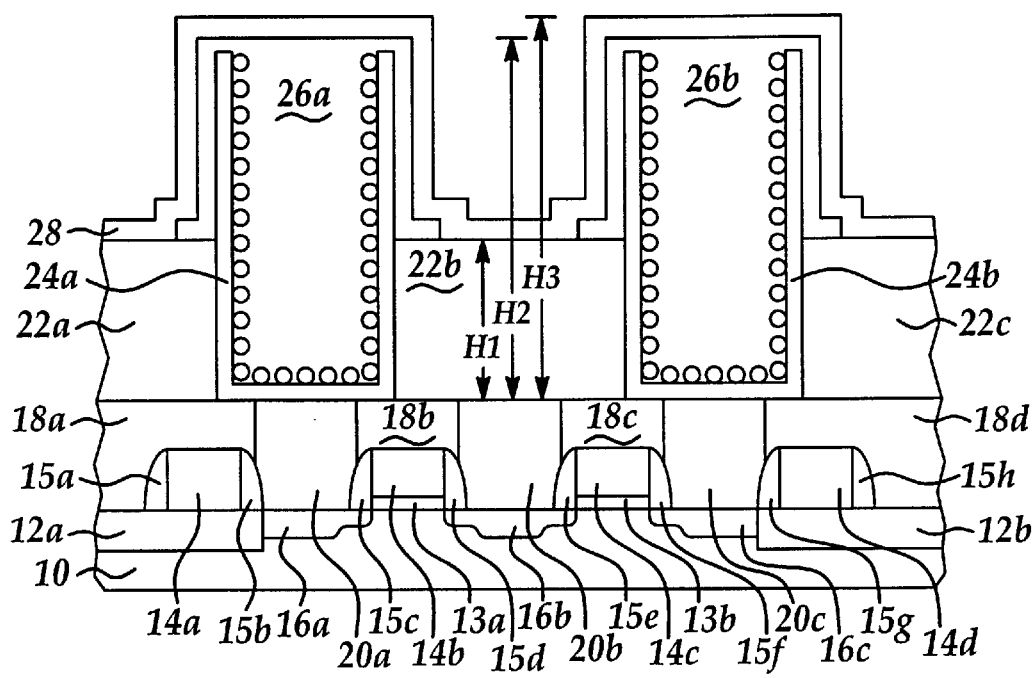
FIG. 1, FIG. 2, FIG. 3 and FIG. 4 show a series of schematic cross-sectional diagrams illustrating the results of progressive stages in forming, in accord with a first preferred embodiment of the present invention, a dynamic random access memory (DRAM) cell structure within a semiconductor integrated circuit fabrication.

Shown in FIG. 1 is a schematic cross-sectional diagram of the semiconductor integrated circuit fabrication at an early stage in its fabrication in accord with the first preferred embodiment of the present invention.

Shown within FIG. 1, in a first instance, is a semiconductor substrate 10 having formed therein a pair of isolation regions 12a and 12b.

Within the preferred embodiment of the present invention with respect to the semiconductor substrate 10, and although semiconductor substrates are known in the art of semiconductor integrated circuit fabrication with either dopant polarity, several dopant concentrations and various crystallographic orientations, for the first preferred embodiment of the present invention, the semiconductor substrate 10 is typically and preferably a (100) silicon semiconductor substrate having at least either N- and P-doped regions.

Similarly, within the first preferred embodiment of the present invention with respect to the pair of isolation regions 12a and 12b, and although it is also known in the art of semiconductor integrated circuit fabrication that isolation regions may be formed employing methods including but not limited to isolation regions thermal growth methods and isolation region deposition/patterning methods, for the first preferred embodiment of the present invention, the isolation regions 12a and 12b are, as is illustrated within the schematic cross-sectional diagram of FIG. 1, formed as shallow trench isolation (STI) regions formed at least in part of a silicon oxide material formed within the semiconductor substrate 10.

Shown also within the schematic cross-sectional diagram of FIG. 1, and formed upon the active region of the semiconductor substrate defined by the pair of isolation regions 12a and 12b, is a pair of field effect transistor (FET) devices comprising: (1) a pair of gate dielectric layers 13a and 13b formed upon the active region of the semiconductor substrate 10; (2) a pair of gate electrodes 14b and 14c aligned upon the pair of gate dielectric layers 13a and 13b; (3) a series of spacer layers 15c, 15d, 15e and 15f formed adjoining a pair of opposite edges of the pair of gate dielectric layers 13a and 13b and the pair of gate electrodes 14b and 14c; and (4) a series of source/drain regions 16a, 16b and 16c formed within the active region of the semiconductor substrate and separated by the pair of gate electrodes 14b and 14c. Similarly, there is also shown within the schematic cross-sectional diagram of FIG. 1 a pair of interconnect structures which comprises: (1) a pair of interconnect layers 14a and 14d formed upon the corresponding isolation regions 12a and 12b; and (2) a series of spacer layers 15a, 15b, 15g and 15h formed adjacent a series of sidewalls of the pair of interconnect layers 14a and 14b.

Within the preferred embodiment of the present invention with respect to each of the foregoing series of structures which comprises the pair of field effect transistor (FET) devices and the pair of interconnect structures, each of the foregoing series of structures which comprises the pair of field effect transistor (FET) devices and the pair of interconnect structures may be formed employing methods and materials as are conventional in the art of semiconductor integrated circuit fabrication.

For example, and without limitation, the pair of gate dielectric layers 13a and 13b is typically and preferably, although not exclusively, formed of a silicon oxide gate dielectric material thermally grown upon the active region of the semiconductor to a thickness of from about 60 to about 80 angstroms. In addition, and also for example, and also without limitation, the pair of gate electrodes 14b and 14c, as well as the pair of interconnect layers 14a and 14d, are typically and preferably, but not exclusively, formed of a gate electrode material such as but not limited to a metal, metal alloy, doped polysilicon (having a dopant concentration of greater than about 5E20 dopant atoms per cubic centimeter) or polycide (doped polysilicon/metal silicide stack) gate electrode material, formed to a thickness of from about 1300 to about 2300 angstroms (although doped polysilicon and polycide gate electrode materials are typically preferred). Further, and also for example, and also without limitation, the series of spacer layers 15a, 15b, 15c, 15d, 15e, 15f, 15g and 15h is typically and preferably formed of a dielectric spacer material, such as but not limited to a silicon nitride dielectric spacer material or a silicon oxynitride dielectric spacer material, formed in a spacer shape while employing an anisotropic etching method. Finally, and also for example, and also without limitation, the series of source/drain regions 16a, 16b and 16c is typically and preferably formed employing an ion implantation method which employs the pair of gate electrodes 14b and 14c as a mask.

Shown also within the schematic cross-sectional diagram of FIG. 1, and formed passivating the pair of field effect transistor (FET) devices and the pair of interconnect structures, is a series of patterned planarized pre-metal dielectric (PMD) layers 18a, 18b, 18c and 18d which defines a series of three first apertures within which is formed a series of three conductive landing studs 20a, 20b and 20c.

Within the first preferred embodiment of the present invention with respect to the series of patterned planarized pre-metal dielectric layers 18a, 18b, 18c and 18d, the series of patterned planarized pre-metal dielectric layers 18a, 18b, 18c and 18d is typically and preferably formed of a silicon oxide dielectric material layer deposited employing an ozone assisted thermal chemical vapor deposition (CVD) method or a high density plasma chemical vapor deposition (HDP-CVD) method, formed and planarized to a thickness of from about 5000 to about 8000 angstroms passivating the pair of field effect transistor (FET) devices and the pair of interconnect structures. The planarized silicon oxide dielectric material layer is then patterned to form the series of three first apertures which accesses the series of source/drain regions 16a, 16b and 16c.

Similarly, once having formed the series of patterned planarized pre-metal dielectric (PMD) layers 18a, 18b, 18c and 18d, the series of conductive landing studs 20a, 20b and 20c is typically and preferably formed within the series of three first apertures defined by the series of patterned planarized pre-metal dielectric (PMD) layers 18a, 18b, 18c and 18d, while employing a blanket deposition and chemical mechanical polish (CMP) planarizing method. Although the series of conductive landing studs 20a, 20b and 20c may be formed from any of several conductor materials, including but not limited to metal, metal alloy, doped polysilicon and polycide conductor materials, for the preferred embodiment of the present invention, the series of conductive landing studs 20a, 20b and 20c is typically and preferably formed of a doped polysilicon conductor material.

Shown also within the schematic cross-sectional diagram of FIG. 1, and formed upon the series of patterned planarized pre-metal dielectric (PMD) layers 18a, 18b, 18c and 18d, is a series of etched back first capacitor node dielectric layers 22a, 22b and 22c which defines a pair of second apertures which leave exposed upper portions of the pair of conductive landing studs 20a and 20c. Similarly, there is also shown within the schematic cross-sectional diagram of FIG. 1, and formed conformally within and extending above the pair of second apertures defined by the series of etched back first capacitor node dielectric layers 22a, 22b and 22c, a pair of patterned conformal first capacitor plate layers 24a and 24b.

Within the first preferred embodiment of the present invention with respect to the series of etched back first capacitor node dielectric layers 22a, 22b and 22c, the series of etched back first capacitor node dielectric layers 22a, 22b and 22c is typically formed of a dielectric material generally analogous to the dielectric material from which is formed the series of patterned planarized pre-metal dielectric (PMD) layers 18a, 18b, 18c and 18d, but with an etch specificity with respect to the dielectric material from which is formed the series of patterned planarized pre-metal dielectric (PMD) layers 18a, 18b, 18c and 18d. Typically and preferably, under circumstances where the series of patterned planarized pre-metal dielectric (PMD) layers 18a, 18b, 18c and 18d is formed of a silicon oxide dielectric material deposited employing an ozone assisted thermal chemical vapor deposition (CVD) method or a high density plasma chemical vapor deposition (HDP-CVD) method, the series of etched back first capacitor node dielectric layers 22a, 22b and 22c is formed of a dense silicon oxide dielectric material formed employing a plasma enhanced chemical vapor deposition (PECVD) method. Similarly, within the preferred embodiment of the present invention with respect to the pair of patterned conformal first capacitor plate layers 24a and 24b, and although other methods and materials may be employed in forming the pair of patterned conformal first capacitor plate layers 24a and 24b, the pair of patterned conformal first capacitor plate layers 24a and 24b is typically and preferably formed of a doped polysilicon material, typically and preferably also formed, as is illustrated within the schematic cross-sectional diagram of FIG. 1, with a hemispherical surface grain, in order to provide enhanced surface area of the pair of patterned conformal first capacitor plate layers 24a and 24b.

As is understood by a person skilled in the art, in order to form the series of etched back first capacitor node dielectric layers 22a, 22b and 22c as illustrated within the schematic cross-sectional diagram of FIG. 1, along with the pair of patterned conformal first capacitor plate layers 24a and 24b as illustrated within the schematic cross-sectional diagram of FIG. 1, there is first formed a blanket first capacitor node dielectric layer which is patterned to form a series of patterned first capacitor node dielectric layers which defines the pair of second apertures which expose upper portions of the pair of conductive landing studs 20a and 20c. There is then formed conformally upon exposed surfaces of the series of patterned first capacitor node dielectric layers and contacting the pair of conductive landing studs 20a and 20c a blanket conformal first capacitor plate layer which is subsequently chemical mechanical polish (CMP) planarized to form the pair of patterned conformal first capacitor plate layers 24a and 24b. The series of patterned first capacitor node dielectric layers is then etched back to form the series of etched back first capacitor node If dielectric layers 22a, 22b and 22c as illustrated within the schematic cross-sectional diagram of FIG. 1.

Typically and preferably, each of the series of etched back first capacitor node dielectric layers 22a, 22b and 22c is formed to a thickness H1 of from about 2000 to about 12000 angstroms. Typically and preferably, each of the pair of patterned conformal first capacitor plate layers 24a and 24b is formed to a thickness of from about 500 to about 800 angstroms, and a height H2 above the corresponding conductive landing stud 20a or 20c of from about 17000 to about 25000 angstroms.

Finally, there is also illustrated within the schematic cross-sectional diagram of FIG. 1, and formed upon exposed portions of the series of etched back first capacitor node dielectric (IMD) layers 22a, 22b and 22c, and the pair of blanket conformal first capacitor plate layers 24a and 24b, a series of layers comprising: (1) a pair of patterned second capacitor plate layers 26a and 26b formed over the corresponding pair of patterned conformal first capacitor plate layers 24a and 24b, the resulting structure having formed thereupon; (2) a blanket conformal sacrificial layer 28. Also present within the semiconductor integrated circuit fabrication whose schematic cross-sectional diagram is illustrated in FIG. 1, but not specifically illustrated within the semiconductor integrated circuit fabrication whose schematic cross-sectional diagram is illustrated in FIG. 1, is a blanket capacitor dielectric layer which is first formed upon exposed portions of the series of etched back first capacitor node dielectric (IMD) layers 22a, 22b and 22c, and the pair of patterned conformal first capacitor plate layers 24a and 24b, prior to forming thereupon and thereover the pair of patterned second capacitor plate layers 26a and 26b.

Within the preferred embodiment of the present invention with respect to the blanket capacitor dielectric layer which is not otherwise specifically illustrated within the schematic cross-sectional diagram of FIG. 1, the blanket capacitor dielectric layer is typically and preferably formed as a laminate of silicon oxide and silicon nitride dielectric materials, formed to a thickness of from about 40 to about 100 angstroms.

Within the preferred embodiment of the present invention with respect to the pair of patterned second capacitor plate layers 26a and 26b, the pair of patterned second capacitor plate layers 26a and 26b is typically and preferably formed employing methods, materials and thickness dimensions analogous or equivalent to the methods, materials and thickness dimensions as employed for forming the pair of patterned conformal first capacitor plate layers 24a and 24b. Typically and preferably, the pair of patterned second capacitor plate layers 26a and 26b is formed such as to fill the pair of cavities defined by the pair of patterned conformal first capacitor plate layers 24a and 24b. Similarly, the pair of patterned second capacitor plate layers 26a and 26b, the capacitor dielectric layer (not otherwise shown) and the pair of patterned first capacitor plate layers 24a and 24b form a pair of capacitor structures of height H3 of from about 19000 to about 27000 angstroms, as illustrated within the schematic cross-sectional diagram of FIG. 1.

Within the first preferred embodiment of the present invention with respect to the blanket conformal sacrificial layer 28, and in accord with further disclosure below, the blanket conformal sacrificial layer 28 is formed of a material which has an enhanced etch rate within a selected isotropic etchant, in comparison with corresponding etch rates of materials from which are formed: (1) a blanket gap filling second capacitor node dielectric layer formed incident to further processing of the semiconductor integrated circuit fabrication whose schematic cross-sectional diagram is illustrated in FIG. 1; and (2) the pair of patterned second capacitor plate layers 26a and 26b. Within the context of the first preferred embodiment of the present invention, the blanket sacrificial layer 28 is typically and preferably formed of either: (1) a doped silicate glass dielectric material (such as a boron, a phosphorus or a boron and phosphorus doped silicate glass dielectric material); or (2) a silicon nitride material, formed to a thickness of from about 300 to about 600 angstroms, in part upon the pair of patterned second capacitor plate layers 26a and 26b.

Figure 2:
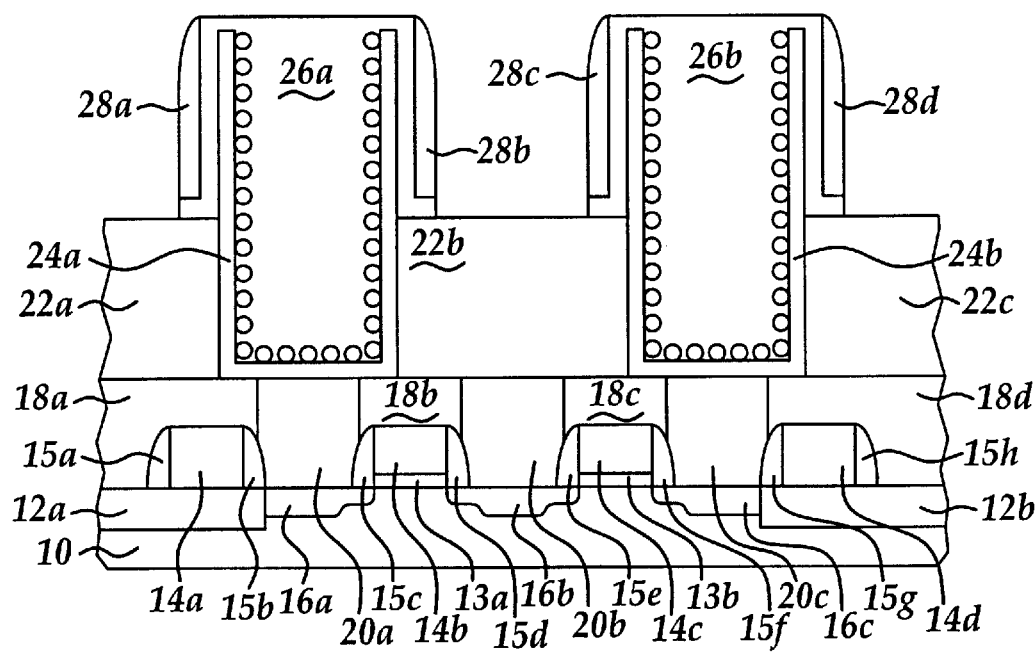

Referring now to FIG. 2, there is shown a schematic cross-sectional diagram illustrating the results of further processing of the semiconductor integrated circuit fabrication whose schematic cross-sectional diagram is illustrated in FIG. 1.

Shown in FIG. 2 is a schematic cross-sectional diagram of a semiconductor integrated circuit fabrication otherwise equivalent to the semiconductor integrated circuit fabrication whose schematic cross-sectional diagram is illustrated in FIG. 1, but wherein, in a first instance, the blanket conformal sacrificial layer 28 has been anisotropically etched to form a series of sacrificial spacer layers 28a, 28b, 28c and 28d adjoining a series of sidewalls of the pair of patterned second capacitor plate layers 26a and 26b. The blanket conformal sacrificial layer 28 may be etched to form the series of sacrificial spacer layers 28a, 28b, 28c and 28d while employing an anisotropic etching method as is otherwise generally conventional in the art of semiconductor integrated circuit fabrication.

Figure 3:
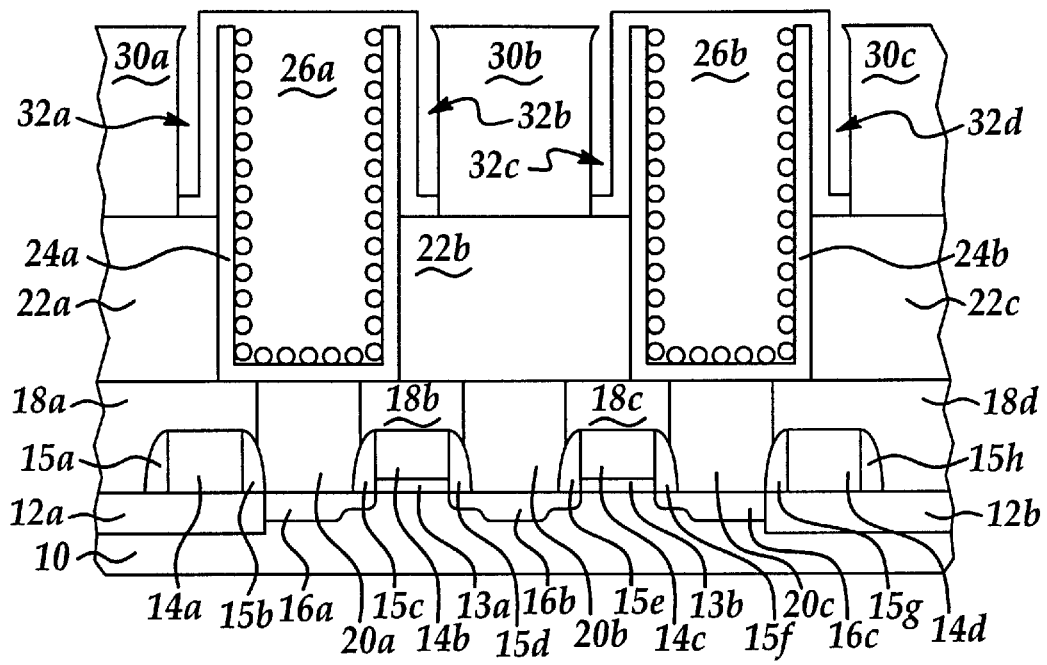

Referring now to FIG. 3, there is shown a schematic cross-sectional diagram illustrating the results of further processing of the semiconductor integrated circuit fabrication whose schematic cross-sectional diagram is illustrated in FIG. 2.

Shown in FIG. 3 is a schematic cross-sectional diagram of a semiconductor integrated circuit fabrication otherwise equivalent to the semiconductor integrated circuit fabrication whose schematic cross-sectional diagram is illustrated in FIG. 2, but wherein there is formed adjoining the series of sacrificial spacer layers 28a, 28b, 28c and 28d a series of etched back planarized second capacitor node dielectric layers 30a, 30b and 30c.

The series of etched back planarized second capacitor node dielectric layers 30a, 30b and 30c is formed in a first instance via planarizing a second capacitor node dielectric layer while employing the pair of patterned second capacitor plate layers 26a and 26b as a pair of planarizing stop layers. Similarly, the series of planarized second capacitor node dielectric (IMD) layers is then slightly etched back to form the series of etched back planarized second capacitor node dielectric layers 30a, 30b and 30c which leaves exposed upper tip portions of the series of sacrificial spacer layers 28a, 28b, 28c and 28d as illustrated within the schematic cross-sectional diagram of FIG. 2.

Finally, and as is illustrated within the schematic cross-sectional diagram of FIG. 3, the series of sacrificial spacer layers 28a, 28b, 28c and 28d is stripped to form a series of air gap voids 32a, 32b, 32c and 32d interposed between corresponding portions of the pair of patterned second capacitor plate layers 26a and 26b, and the series of etched back planarized second capacitor node dielectric layers 30a, 30b and 30c.

Within the first preferred embodiment of the present invention when the series of sacrificial spacer layers 28a, 28b, 28c and 28d is formed of a doped silicate glass, such as a boro-silicate glass (BSG), phospho-silicate glass (PSG) or boro-phosphosilicate glass (BPSG) the series of sacrificial spacer layers 28a, 28b, 28c and 28d may be stripped while employing a vaporous hydrofluoric acid etchant having an enhanced etch rate for the doped silicate glass material from which is formed the series of sacrificial spacer layers 28a, 28b, 28c and 28d in comparison with an undoped silicate glass (USG) material from which is preferably formed the series of etched back planarized second capacitor node dielectric layers 30a, 30b and 30c. Under analogous circumstances where the series of sacrificial spacer layers 28a, 28b, 28c and 28d is formed of a silicon nitride material, an aqueous phosphoric acid etchant is similarly selective and appropriate.

Figure 4:
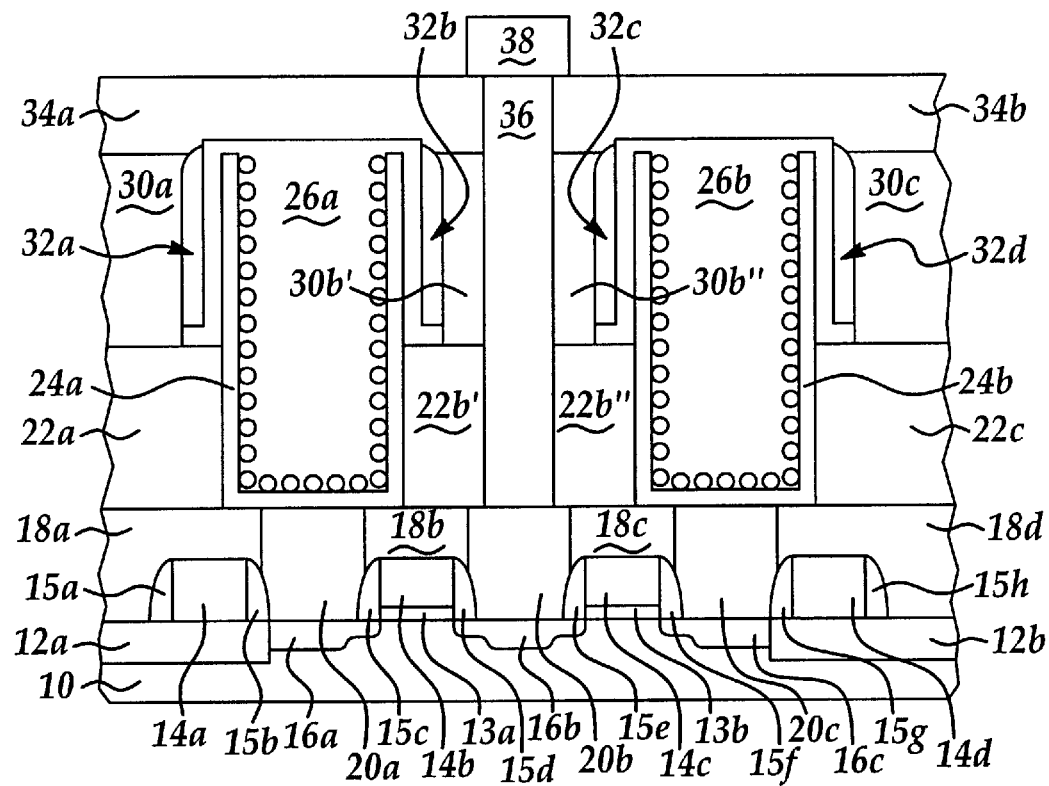

Referring now to FIG. 4, there is shown a schematic cross-sectional diagram illustrating the results of further processing of the semiconductor integrated circuit fabrication whose schematic cross-sectional diagram is illustrated in FIG. 3.

Shown in FIG. 4 is a schematic cross-sectional diagram of a semiconductor integrated circuit fabrication otherwise equivalent to the semiconductor integrated circuit fabrication whose schematic cross-sectional diagram is illustrated in FIG. 3, but wherein, in a first instance, there is formed a pair of patterned capping dielectric layers 34a and 34b capping and planarizing, respectively, the pair of patterned second capacitor plate layers 26a and 26b, and laterally adjoining layers. Within the first preferred embodiment of the present invention, the pair of patterned capping dielectric layers 34a and 34b is typically and preferably formed to a thickness of from about 2000 to about 5000 angstroms, and formed from a dielectric material analogous or equivalent to the dielectric material from which is formed the series of etched back planarized second capacitor node dielectric layers 30a, 30b and 30c.

Finally, there is also shown within the schematic cross-sectional diagram of FIG. 4 formed into a third aperture reaching the conductive landing plug 20b a bitline stud layer 36 having formed thereupon a patterned first conductor layer 38. As is illustrated within the schematic cross-sectional diagram of FIG. 4, the third aperture is defined by: (1) the pair of patterned capping dielectric layers 34a and 34b; (2) a pair of patterned etched back planarized second capacitor node dielectric layers 30b' and 30b" formed from the etched back planarized second capacitor node dielectric layer 30b; and (3) a pair of patterned etched back first capacitor node dielectric layers 22b' and 22b" formed from the etched back first capacitor node dielectric (IMD) layer 22b.

As is understood by a person skilled in the art, within the semiconductor integrated circuit fabrication whose schematic cross-sectional diagram is illustrated in FIG. 4, and in accord with the above disclosure: (1) the pair of patterned conformal first capacitor plate layers 24a and 24b, in conjunction with; (2) a pair of patterned capacitor dielectric layers (not shown); and (3) the pair of patterned second capacitor plate layers 26a and 26b, comprise a pair of capacitor structures, and in particular a pair of stacked container capacitor structures. The pair of capacitor structures provides a pair of sidewalls, in general having an overall height H3 (as illustrated within the schematic cross-sectional diagram of FIG. 1, from the bottom of a first capacitor plate to top of a second capacitor plate) of from about 19000 to about 27000 angstroms. As is also illustrated within the schematic cross-sectional diagram of FIG. 4, the bitline stud layer 36 is adjacent to and rises above the pair of sidewalls of the pair of capacitor structures, while being separated therefrom in part by the pair of air gap voids 32b and 32c. In turn, each of the pair of air gap voids 32b and 32c is typically and preferably formed with a horizontal linewidth of from about 300 to about 600 angstroms and a vertical height of from about 4000 to about 24000 angstroms adjacent a capacitor structure to thus occupy about 20 to about 60 percent of a horizontal distance between the bitline stud layer 36 and a capacitor structure and about 30 to about 80 percent of the height of a capacitor structure.

Upon forming the semiconductor integrated circuit a fabrication whose schematic cross-sectional diagram is illustrated in FIG. 4, there is provided within a semiconductor integrated circuit fabrication a dynamic random access memory (DRAM) cell structure with enhanced performance. The dynamic random access memory (DRAM) cell structure has enhanced performance incident to being formed with an air gap void interposed between: (1) a bitline stud layer; and (2) a capacitor structure adjacent to which is formed and above which rises the bitline stud layer, within the dynamic random access memory (DRAM) cell structure. The enhanced performance of the dynamic random access memory (DRAM) cell structure derives from reduced capacitive coupling between the bitline stud layer and both of a pair of capacitor plate layers within the capacitor structure.

As is finally understood by a person skilled in the art, although the schematic cross-sectional diagrams of FIG. 3 and FIG. 4 illustrate the air gap voids 32a, 32b, 32c and 32d (which are intended to include vacuum evacuated voids or other gas filled voids) as being formed prior to the bitline stud layer 36, a reverse ordering of formation of those components is also within the context of the present invention, but generally not preferred.

Second Preferred Embodiment

Referring now to FIG. 5 to FIG. 8, there is shown a series of schematic cross-sectional diagrams illustrating the results of forming, in accord with a second preferred embodiment of the present invention, an additional dynamic random access memory (DRAM) cell structure within an additional semiconductor integrated circuit fabrication.

Figure 5:
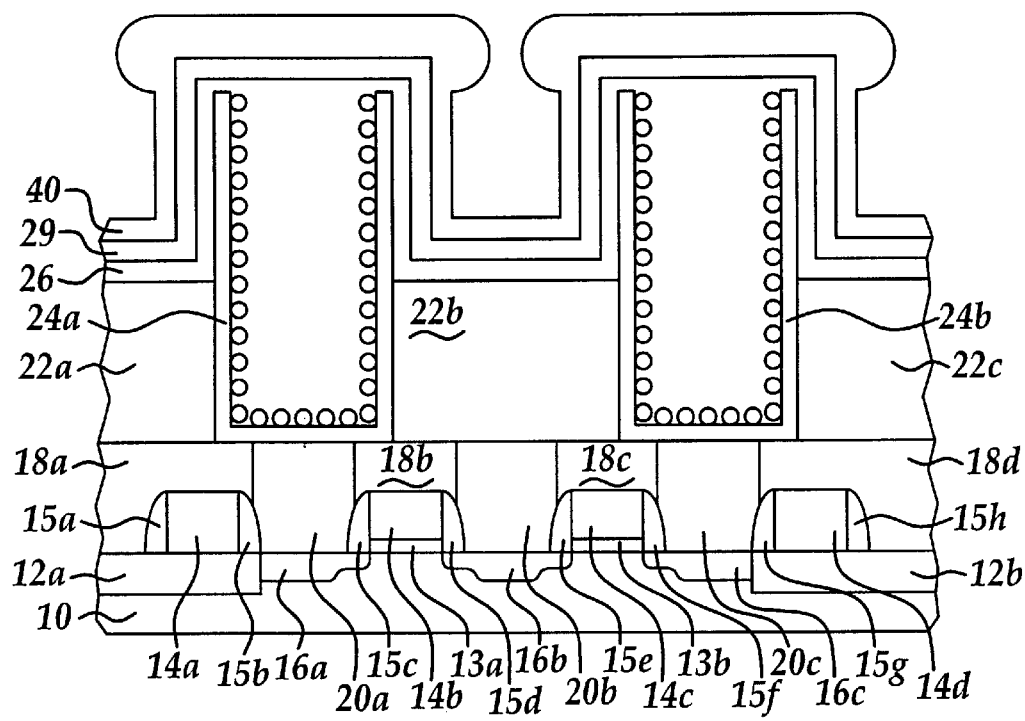
FIG. 5, FIG. 6, FIG. 7 and FIG. 8 show a series of schematic cross-sectional diagrams illustrating the results of progressive stages in forming, in accord with a second preferred embodiment of the present invention, a dynamic random access memory (DRAM) cell structure within a semiconductor integrated circuit fabrication.

Shown in FIG. 5 is a schematic cross-sectional diagram of the additional semiconductor integrated circuit fabrication at an early stage in its fabrication in accord with the second preferred embodiment of the present invention.

Shown in FIG. 5 is a semiconductor integrated circuit fabrication generally analogous to the semiconductor integrated circuit fabrication whose schematic cross-sectional diagram is illustrated in FIG. 1 but wherein: (1) the pair of patterned second capacitor plate layers 26a and 26b is replaced by a blanket second capacitor plate layer 26 from which will be formed a pair of patterned second capacitor plate layers; and (2) the blanket sacrificial layer 28 is replaced with a blanket conformal first masking layer 29 which is optional within the second preferred embodiment of the present invention. The blanket conformal first masking layer 29 may be formed employing methods and materials analogous or equivalent to the methods and materials employed for forming the blanket conformal sacrificial layer 28 within the first preferred embodiment of the present invention. Typically and preferably, the blanket conformal first masking layer 29 is formed of a uniform thickness in a range of from about 200 to about 300 angstroms from a silicon nitride material, although other materials having an appropriate etch selectivity with respect to adjoining layers may also be employed.

Similarly, there is also shown within the schematic cross-sectional diagram of FIG. 5 a variable thickness blanket second masking layer 40 formed upon the optional blanket conformal first masking layer 29. As is further illustrated within the schematic cross-sectional diagram of FIG. 5, the variable thickness blanket second masking layer 40 is thicker over upper topographic (i.e., horizontal) portions of the topographic blanket conformal first masking layer 29 and the corresponding topographic blanket second capacitor plate layer 26 and thinner over sidewall and lower topographic (i.e., horizontal) portions of the blanket conformal first masking layer 29 and the blanket second capacitor plate 26.

Although other methods and materials are not precluded for forming the variable thickness blanket second masking layer 40 with the topographic variations as illustrated over the topographically varied blanket second capacitor plate layer 26, the variable thickness blanket second masking layer 40 is typically and preferably formed of a passivating fluoropolymer material deposited employing a plasma enhanced chemical vapor deposition (PECVD) method in turn employing an octafluorocyclobutane source material and a carbon monoxide source material, although other source materials may also be employed. Typically and preferably, the plasma enhanced chemical vapor deposition (PECVD) method also employs: (1) a reactor chamber pressure of from about 100 to about 200 mtorr; (2) a source radio frequency of from about 800 to about 1300 watts; (3) a substrate (and overlying layers) temperature of from about 25 to about 45 degrees centigrade; (4) an octafluorocyclobutane flow rate of from about 20 to about 80 standard cubic centimeters per minute (sccm); and (5) a carbon monoxide flow rate of from about 200 to about 400 standard cubic centimeters per minute (sccm). Typically and preferably, the variable thickness blanket second masking layer 40 is formed to a thickness of from about 2500 to about 3500 angstroms over the upper topographic horizontal plateau portions of the blanket second capacitor plate layer 26 and of a thickness from about 500 to about 1500 angstroms over sidewall and lower topographic horizontal plateau portions of the blanket second capacitor plate layer 26.

Figure 6:
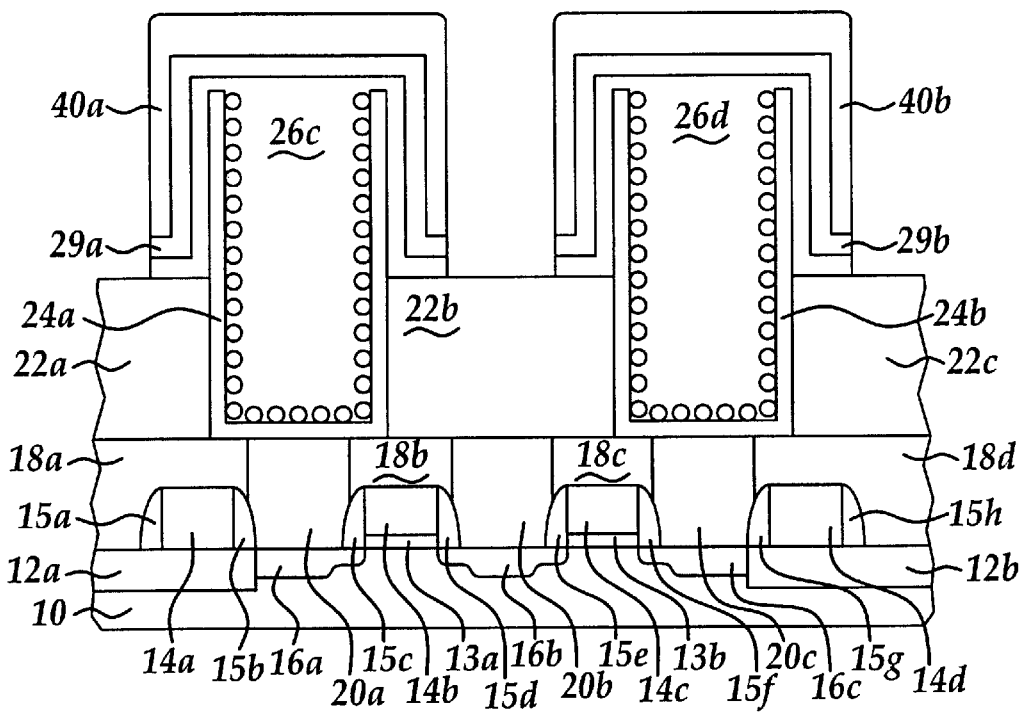

Referring now to FIG. 6, there is shown a schematic cross-sectional diagram illustrating the results of further processing of the semiconductor integrated circuit fabrication whose schematic cross-sectional diagram is illustrated in FIG. 5.

Shown in FIG. 6 is a schematic cross-sectional diagram of a semiconductor integrated circuit fabrication otherwise equivalent to the semiconductor integrated circuit fabrication whose schematic cross-sectional diagram is illustrated in FIG. 5, but wherein the variable thickness blanket second masking layer 40, the blanket conformal first masking layer 29 and the blanket second capacitor plate layer 26 have been etched completely through at their lower topographic portions to form a corresponding pair of variable thickness patterned first masking layers 40a and 40b, a corresponding pair of patterned conformal first masking layers 29a and 29b and a corresponding pair of patterned second capacitor plate layers 26c and 26d, while employing an appropriate etching plasma, which is not otherwise illustrated. The etching plasma employs an etchant gas composition, or series of etchant gas compositions, appropriate in particular to the material from which is formed the blanket second capacitor plate layer 26. Within the etching plasma, horizontal portions of the variable thickness blanket second masking layer 40 are generally uniformly consumed, such that upper topographic horizontal portions of the blanket conformal first masking layer 29 and the blanket second capacitor plate 26 are not etched, but covered by the pair of variable thickness patterned second masking layers 40a and 40b of reduced thickness of from about 1000 to about 1500 angstroms.

Figure 7:
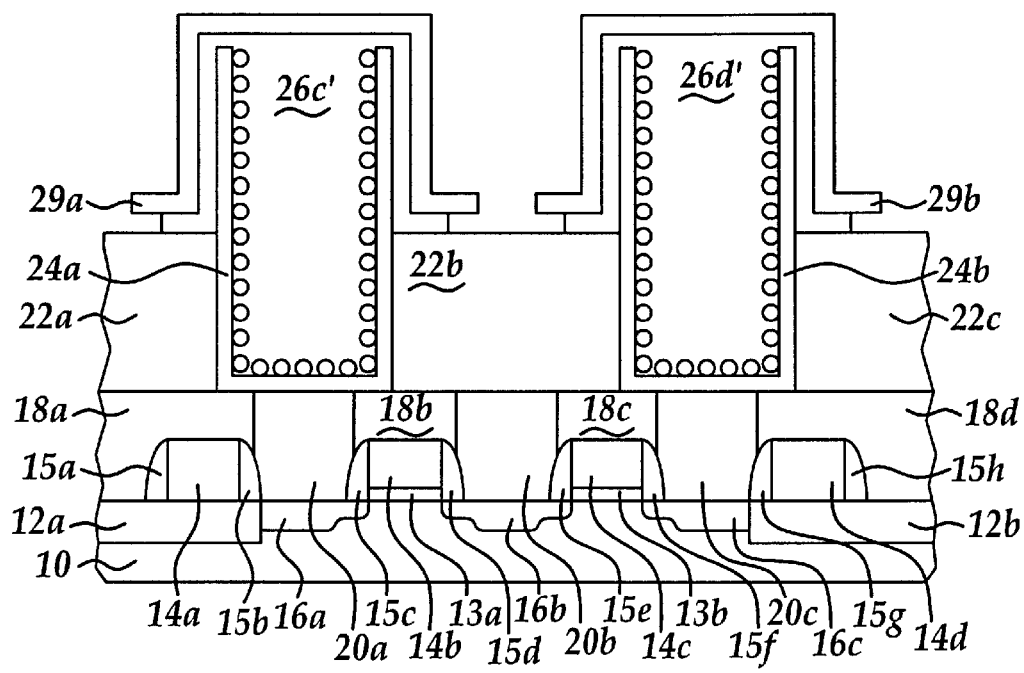

Referring now to FIG. 7, there is shown a schematic cross-sectional diagram illustrating the results of further processing of the semiconductor integrated circuit fabrication whose schematic cross-sectional diagram is illustrated in FIG. 6.

Shown in FIG. 7 is a schematic cross-sectional diagram of a semiconductor integrated circuit fabrication otherwise equivalent to the semiconductor integrated circuit fabrication whose schematic cross-sectional diagram is illustrated in FIG. 6, but wherein the pair of variable thickness patterned second masking layers 40a and 40b have been stripped from the pair of patterned conformal first masking layers 29a and 29b. The pair of variable thickness patterned second masking layers 40a and 40b may be stripped employing methods and materials as are conventional in the art of semiconductor integrated circuit microelectronic fabrication, which will typically and preferably include $O_2$ etchants.

As is also shown within the schematic cross-sectional diagram of FIG. 7, exposed sidewall portions of the pair of patterned second capacitor plate layers 26c and 26d have been etched back beneath the pair of patterned conformal first masking layers 29a and 29b to form a pair of etched back patterned second capacitor plate layers 26c' and 26d'. The pair of patterned second capacitor plate layer 26c and 26d may be etched back beneath the pair of patterned conformal first masking layers 29a and 29b while employing a wet chemical isotropic etchant, such as a nitric/hitric acid wet chemical isotropic etchant, as is conventional in the art of microelectronic fabrication.

Figure 8:
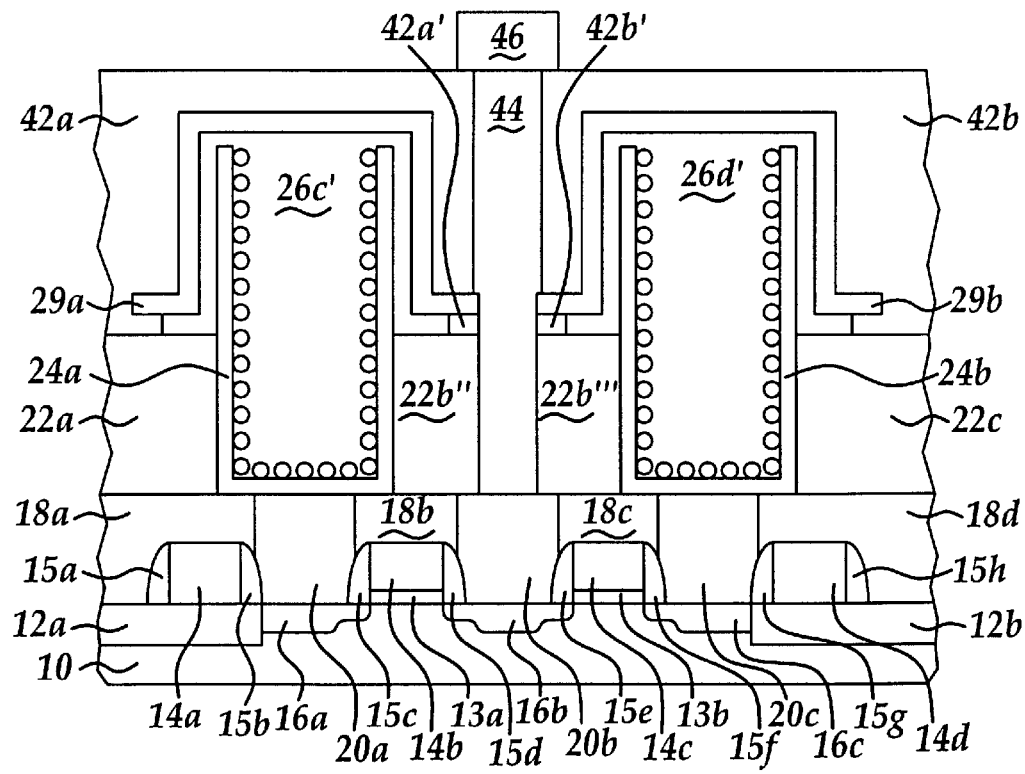

Referring now to FIG. 8, there is shown a schematic cross-sectional diagram illustrating the results of further processing of the semiconductor integrated circuit fabrication whose schematic cross-sectional diagram is illustrated in FIG. 7.

Shown in FIG. 8 is a schematic cross-sectional diagram of a semiconductor integrated circuit fabrication otherwise equivalent to the semiconductor integrated circuit fabrication whose schematic cross-sectional diagram is illustrated in FIG. 7, but wherein there is formed upon the semiconductor integrated circuit fabrication a blanket capping dielectric layer from which is formed a pair of patterned capping dielectric layers 42a and 42b. The blanket capping dielectric layer is typically and preferably formed employing methods and materials analogous or equivalent to the methods and materials employed for forming the series of etched back first capacitor node dielectric (IMD) layers 22a, 22b and 22c.

Finally, there is illustrated within the schematic cross-sectional diagram of FIG. 8 formed through the blanket capping dielectric layer and the etched back first capacitor node dielectric layer 22b a third aperture defined by: (1) the pair of patterned capping dielectric layers 42a and 42b; (2) the optional pair of patterned conformal first masking layers 29a and 29b; (3) a pair of patterned capping dielectric layer residues 42a' and 42b'; and (4) a pair of patterned etched back first inter-metal dielectric layers 22b''' and 22b'''. Similarly, the third aperture has formed therein a bitline stud layer 44 having formed thereupon a patterned first conductor layer 46.

Within the second preferred embodiment of the present invention, the third aperture, the bitline stud layer 44 and the patterned first conductor layer 46 are generally analogous to the third aperture, the bitline stud layer 36 and the patterned first conductor layer 38 within the first preferred embodiment of the present invention as illustrated within the schematic cross-sectional diagram of FIG. 4.

As is understood by a person skilled in the art, the optional patterned conformal first masking layers 29a and 29b provide for alignment of the bitline stud layer 44 and proper passivation of sidewall portions of the pair of etched back patterned second capacitor plate layers 26c' and 26d''.

Upon forming the semiconductor integrated circuit fabrication whose schematic cross-sectional diagram is illustrated in FIG. 8, there is formed a semiconductor integrated circuit fabrication having readily formed therein a dynamic random access memory cell structure. The second preferred embodiment of the present invention realizes the foregoing object by forming a patterned upper capacitor plate layer within a storage capacitor within a dynamic random access memory (DRAM) cell structure while employing a self aligned etching method which employs a variable thickness blanket masking layer having a thickness which varies with a topography of a topographic blanket upper capacitor plate layer from which is formed the patterned upper capacitor plate layer.

As is understood by a person skilled in the art, the preferred embodiments of the present invention are illustrative of the present invention rather than limiting of the present invention. Revisions and modifications may be made to methods, materials, structures and dimensions through which is provided a semiconductor integrated circuit microelectronic fabrication in accord with the preferred embodiments of the present invention, while still providing: (1) a method for forming memory cell structure; or (2) a method for forming a capacitor plate layer, in accord with the present invention, further in accord with the accompanying claims.

What is claimed is:

1. A method for fabricating a memory cell structure comprising:

providing a semiconductor substrate;

forming within and upon the semiconductor substrate a field effect transistor (FET) device comprising a gate dielectric layer formed upon the semiconductor substrate, a gate electrode formed upon the gate dielectric layer and a pair of source/drain regions formed into the semiconductor substrate and separated by the gate electrode;

forming over the field effect transistor (FET) device, and electrically connected with one of the pair of source/drain regions, a capacitor structure having a sidewall;

forming laterally adjacent the sidewall of the capacitor structure a sacrificial spacer layer;

forming laterally adjacent the sacrificial spacer layer and further spaced from the sidewall of the capacitor structure a passivating dielectric layer;

forming through the passivating dielectric layer a bitline stud layer electrically connected with the other of the pair of source/drain regions; and stripping from adjacent the sidewall of the capacitor structure the sacrificial spacer, such as to provide an air gap void interposed between the capacitor structure and bitline stud layer.

2. The method of claim 1 wherein the memory cell structure is a dynamic random access memory (DRAM) memory cell structure.

3. The method of claim 1 wherein the sidewall of the capacitor structure has a height of from about 12000 to about 25000 angstroms.

4. The method of claim 1 wherein the air gap void has a horizontal linewidth of from about 200 to about 400 angstroms and a vertical height of from about 3000 to about 7000 angstroms.

5. The method of claim 1 wherein the air gap void occupies from about 15 to about 35 percent of a horizontal distance between the bitline stud layer and the sidewall of the capacitor structure.

6. The method of claim 1 wherein the air gap void occupies from about 20 to about 35 percent of a vertical height of the sidewall of the capacitor structure.

7. A method for fabricating a memory cell structure comprising:

providing a semiconductor substrate;

forming within and upon the semiconductor substrate a field effect transistor (FET) device comprising a gate dielectric layer formed upon the semiconductor substrate, a gate electrode formed upon the gate dielectric layer and a pair of source/drain regions formed into the semiconductor substrate and separated by the gate electrode;

forming over the field effect transistor (FET) device, and electrically connected with one of the pair of source/drain regions, a capacitor structure comprising a blanket capacitor plate layer having an upper topographic portion and a lower topographic portion;

forming over the blanket capacitor plate layer a variable thickness blanket mask layer having a greater thickness over the upper topographic portion of the blanket capacitor plate layer than the lower topographic portion of the blanket capacitor plate layer; and etching completely through the variable thickness blanket mask layer and the blanket capacitor plate layer at the lower typographic portions thereof to form a patterned capacitor plate layer having formed thereupon a variable thickness patterned mask layer.

8. The method of claim 7 wherein the variable thickness blanket masking layer is formed of a fluoropolymer passivating material.

9. The method of claim 7 wherein:

the variable thickness blanket masking layer has a thickness of from about 2500 to about 3500 angstroms over the upper topographic portion of the blanket capacitor plate layer;

the variable thickness blanket masking layer has a thickness of from about 500 to about 800 angstroms over the lower topographic portion of the blanket capacitor plate layer.

10. The method of claim 7 further comprising:

forming a blanket conformal masking layer upon the blanket capacitor plate layer prior to forming the variable thickness blanket masking layer over the blanket conformal masking layer and the blanket capacitor plate layer; and etching sequentially and completely through a lower topographic portion of the variable thickness blanket masking layer, the blanket conformal masking layer and the blanket capacitor plate layer to form a corresponding variable thickness patterned masking layer, patterned conformal masking layer and patterned capacitor plate layer.

11. The method of claim 10 wherein the blanket conformal first masking layer is formed to a thickness of from about 200 to about 300 angstroms.

12. The method of claim 10 further comprising laterally etching the patterned capacitor plate layer beneath the patterned conformal making layer.

* * * * *